(12) United States Patent
Nihei

(10) Patent No.: US 11,658,665 B2
(45) Date of Patent: May 23, 2023

(54) CLOCK SYNCHRONIZATION CIRCUIT, SEMICONDUCTOR DEVICE, AND CLOCK SYNCHRONIZATION METHOD

(71) Applicant: LAPIS TECHNOLOGY CO., LTD., Kanagawa (JP)

(72) Inventor: Daisuke Nihei, Kanagawa (JP)

(73) Assignee: LAPIS TECHNOLOGY CO., LTD., Yokohama (JP)

( * ) Notice: Subject to any disclaimer, the term of this patent is extended or adjusted under 35 U.S.C. 154(b) by 0 days.

(21) Appl. No.: 17/700,997

(22) Filed: Mar. 22, 2022

(65) Prior Publication Data

US 2022/0321131 A1     Oct. 6, 2022

(30) Foreign Application Priority Data

Mar. 31, 2021    (JP) .............................. JP2021-060533

(51) Int. Cl.
    *H03L 7/00*          (2006.01)
    *H03K 19/20*       (2006.01)

(52) U.S. Cl.
    CPC .............. *H03L 7/00* (2013.01); *H03K 19/20* (2013.01)

(58) Field of Classification Search
None
See application file for complete search history.

(56) References Cited

U.S. PATENT DOCUMENTS 11,126,216 B2 *   9/2021   Oh .......................... G06F 1/06
2022/0247411 A1 *   8/2022   Lan ......................... G06F 1/12

FOREIGN PATENT DOCUMENTS

JP      S62-220037 A     9/1987

OTHER PUBLICATIONS

English translation of JPS62-220037, 4 pgs.

* cited by examiner

*Primary Examiner* — Cassandra F Cox
(74) *Attorney, Agent, or Firm* — Volentine, Whitt & Francos, PLLC

(57) ABSTRACT

A clock synchronization circuit that includes a signal generation circuit configured to generate a first signal and a second signal by receiving a signal output under a first clock with two logic circuits that respectively operate under a second clock different from the first clock; and a synchronization circuit configured to receive the first signal, the second signal, and a synchronization enabling signal for adjusting phases of the first signal and the second signal, and control the phases of the first signal and the second signal using a first output result from a logical operation performed on the second signal and on a result of a logical operation with the first signal and the synchronization enabling signal, and using a second output result from a logical operation performed on the first signal and on a result of a logical operation with the second signal and the synchronization enabling signal.

18 Claims, 10 Drawing Sheets

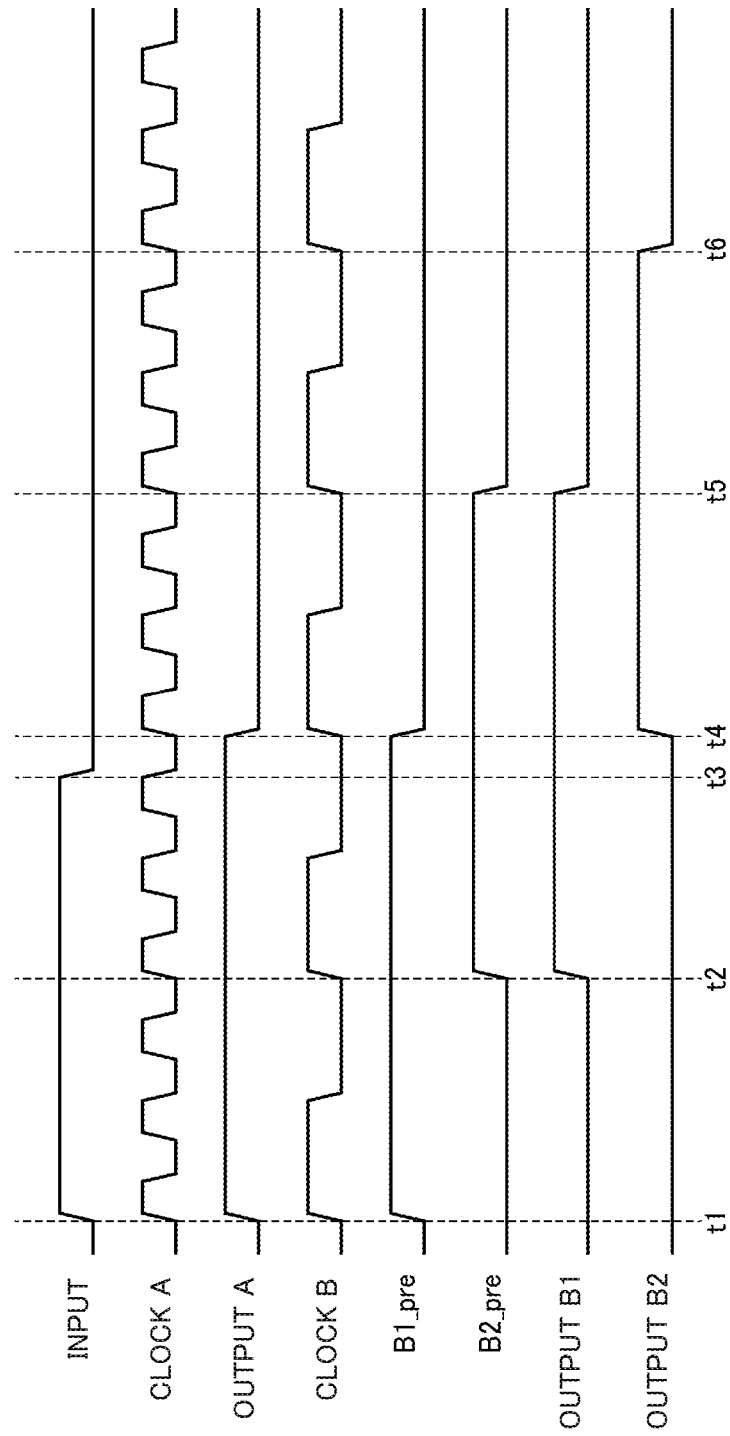

CLOCK SYNCHRONIZATION CIRCUIT, SEMICONDUCTOR DEVICE, AND CLOCK SYNCHRONIZATION METHOD

CROSS-REFERENCE TO RELATED APPLICATION

This application is based on and claims priority under 35 USC 119 from Japanese Patent Application No. 2021-060533 filed on Mar. 31, 2021, the disclosure of which is incorporated by reference herein.

BACKGROUND

Technical Field

The present disclosure is related to a clock synchronization circuit, a semiconductor device, and a clock synchronization method.

Related Art

Parallel synchronization circuits are known for parallel synchronizing of the phases of signals. A circuit for synchronization recovery is disclosed in Japanese Patent Application Laid-Open (JP-A) No. S62-220037 in which logical operations are performed according to the results of detecting the frame pattern of a signal.

In cases in which there is an output (output A) synchronized to a clock (clock A), and from the output A two outputs (outputs B) are generated that are synchronized to a clock (clock B), which is a separate clock to clock A, the phases of the two outputs B are ideally synchronized. However, there is misalignment between the phases of the two outputs B in cases in which the output A is not received at the rising timing of clock B.

SUMMARY

A clock synchronization circuit according to an aspect of the present disclosure includes a signal generation circuit configured to generate a first signal and a second signal by receiving a signal output under a first clock with two logic circuits that respectively operate under a second clock that is different from the first clock, and a synchronization circuit configured to receive the first signal, the second signal, and a synchronization enabling signal for adjusting phases of the first signal and the second signal, and control the phases of the first signal and the second signal using a first output result from a logical operation performed on the second signal and on a result of a logical operation with the first signal and the synchronization enabling signal, and using a second output result from a logical operation performed on the first signal and on a result of a logical operation with the second signal and the synchronization enabling signal.

BRIEF DESCRIPTION OF THE DRAWINGS

Exemplary embodiments of the present disclosure will be described in detail based on the following figures, wherein:

FIG. 10 is timing chart to explain operation of the signal generation circuit illustrated in FIG. 9.

DETAILED DESCRIPTION

Figure 1:
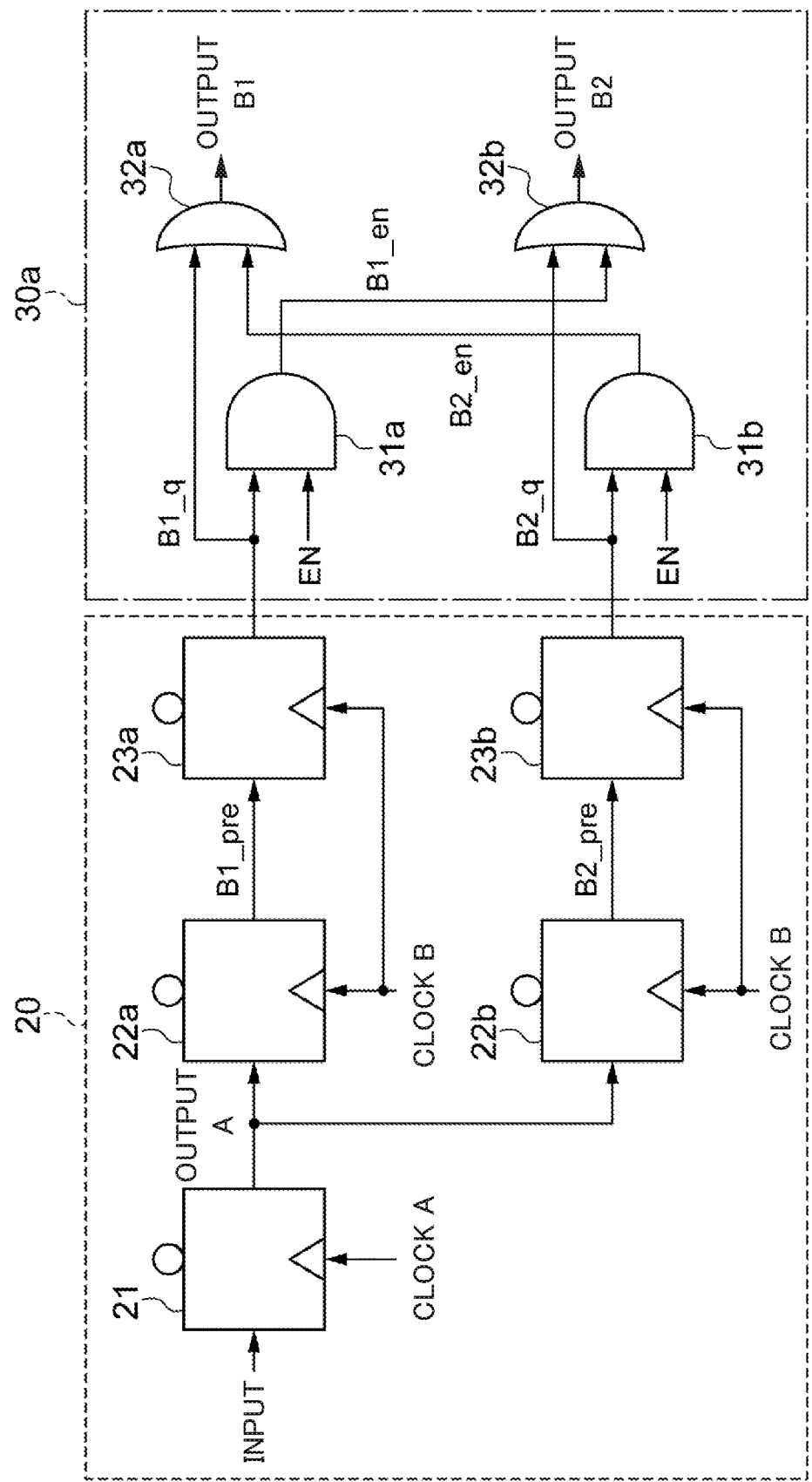
FIG. 1 is a diagram illustrating an example of a clock synchronization circuit according to a first exemplary embodiment of the present disclosure.

Explanation follows regarding an example of an exemplary embodiment of the present disclosure, with reference to the drawings. Note that the same or equivalent configuration elements and portions in each of the drawings are appended with the same reference numerals. Moreover, the dimensional proportions in the drawings are exaggerated for ease of explanation, and sometimes differ from actual proportions.

Premises

Prior to explaining the exemplary embodiments of the present disclosure, premised circuits for the exemplary embodiments of the present disclosure will first be explained.

Figure 8:
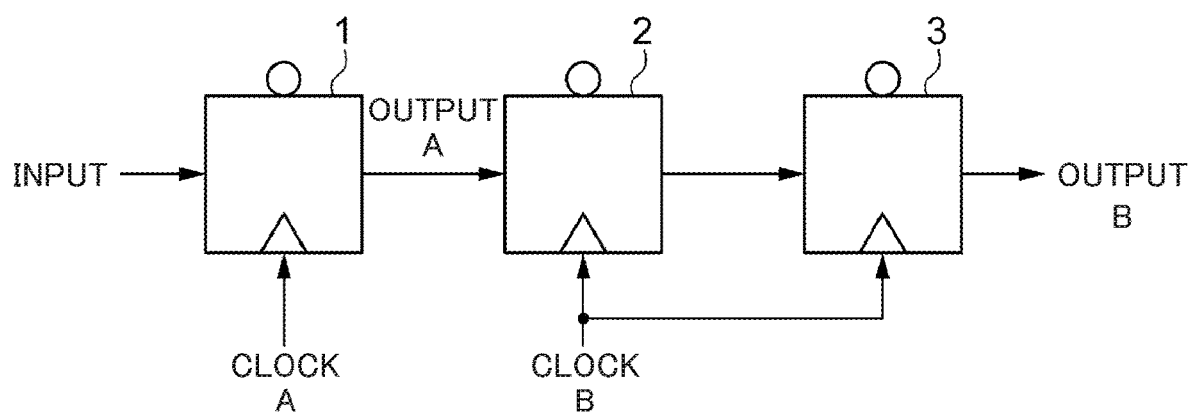
FIG. 8 is a diagram illustrating an example of a premised signal generation circuit for the exemplary embodiments of the present disclosure.

FIG. 8 is a diagram illustrating an example of a premised signal generation circuit for the exemplary embodiments of the present disclosure. The signal generation circuit illustrated in FIG. 8 is a circuit for synchronizing asynchronous inputs. In the present circuit, an output A of a flip-flop 1 receiving an input of clock A is employed by flip-flops 2, 3 to generate an output B synchronized to a clock B.

Figure 9:
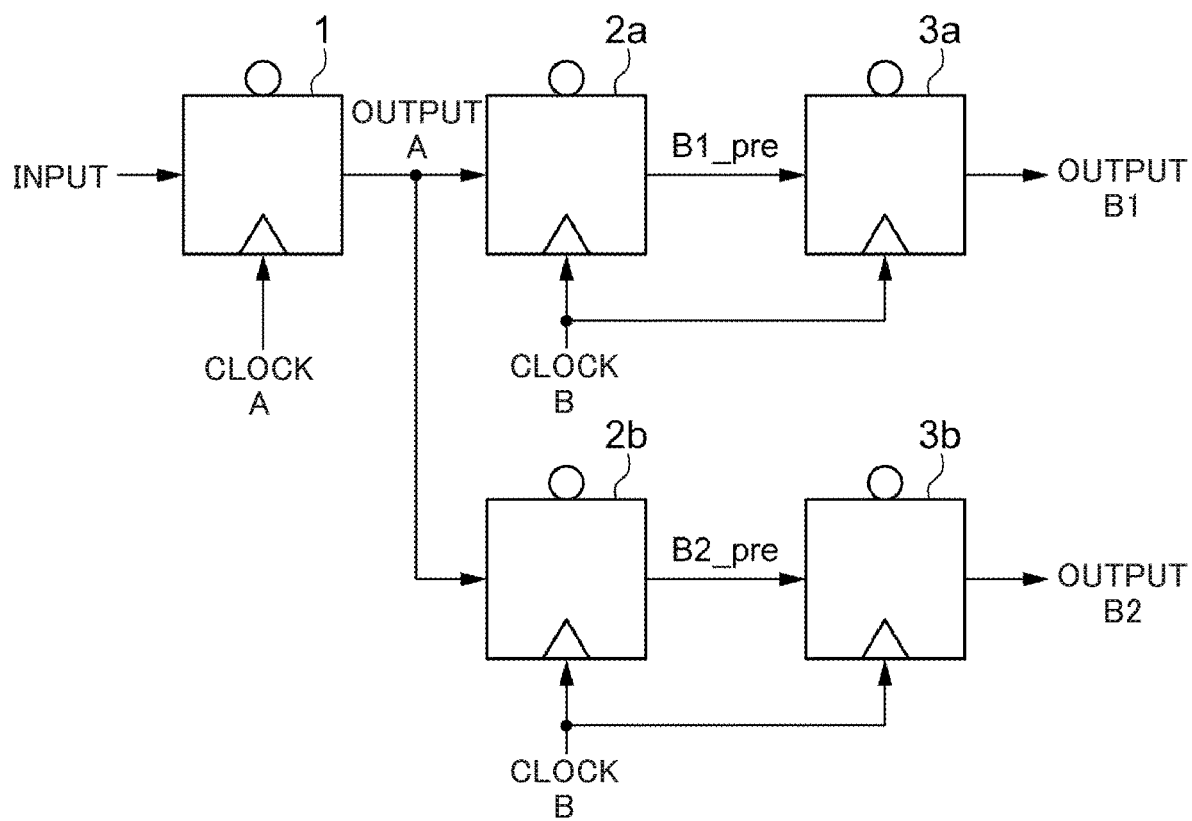
FIG. 9 is a diagram illustrating an example of a premised signal generation circuit for the exemplary embodiments of the present disclosure.

There are also cases in which two outputs B are generated from an output A of flip-flop 1. FIG. 9 is a diagram illustrating an example of a premised signal generation circuit for the exemplary embodiments of the present disclosure. The signal generation circuit illustrated in FIG. 9 is a circuit for synchronizing asynchronous inputs. In the present circuit, an output A of a flip-flop 1 receiving an input under clock A is employed by flip-flops 2a, 3a synchronized to a clock B to generate an output B1, and by flip-flops 2b, 3b also synchronized to the clock B to generate an output B2.

Depending on the timing the output A is respectively received by the flip-flops 2a, 2b, sometimes the phases of the two outputs B1, B2 generated based on the clock B are not aligned with each other.

FIG. 10 is a timing chart to explain operation of the signal generation circuit illustrated in FIG. 9.

When at a point in time t1 an input transitions from GND level, i.e. L (LOW), to a VDD level, i.e. H (HIGH), the flip-flop 1 receiving and operating under the clock A changes the output A from L to H at a switching timing when the clock A switches from L to H, and outputs the output A. The input then transitions from H to L at time t3 after time t1. Note that switching of the input from H to L is not performed instantaneously, and requires a specific period of time.

When the input has transitioned from H to L at time t3, the flip-flop 1 then changes the output A from H to L at the point in time t4 when the clock A next switches from L to H, and outputs the output A.

The flip-flop 2a that receives and operates under the clock B is input with the output A, and changes an output B1_pre from L to H at a switching timing the output A switches from L to H, and outputs the output B1_pre. The flip-flop 3a that similarly receives and operates under the clock B is input with the output B1_pre, and changes an output B1 from L to H at a time t2 one cycle of the clock B from after the output B1_pre has switched from L to H, and outputs the output B1. Reference here to one cycle means, for example, a period from time t1 to time t2 under the clock B that is a period from when the clock starts to transition from L to H in until the clock next starts to transition from L to H, or on the other hand, is a period from when the clock starts to transition from H to L until the clock next starts to transition from H to L.

The flip-flop 2a changes the output B1_pre from H to L at the timing the output A switches from H to L, and outputs the output B1_pre. The flip-flop 3a changes the output B1 from H to L at time t5 one cycle of the clock B from after the output B1_pre has switched from H to L, and outputs the output B1.

The flip-flop 2b that similarly receives and operates under the clock B is input with the output A, and changes an output B2_pre from L to H not at the timing the output A has switched from L to H, but at a time t2 one cycle of the clock B from after the output B1_pre has switched from L to H, and outputs the output B2_pre. The flip-flop 3b that similarly receives and operates under the clock B is input with the output B2_pre, and changes an output B2 from L to H at a time t4 one cycle of the clock B from after the output B2_pre has switched from L to H, and outputs the output B2.

The flip-flop 2b then changes the output B2_pre from H to L at time t5 one cycle of the clock B from after the output A has switched from H to L, and outputs the output B2_pre. The flip-flop 3b changes the output B2 from H to L at time t6 one cycle of the clock B from after the output B2_pre has switched from H to L, and outputs the output B2.

The signal generation circuit illustrated in FIG. 8 accordingly, in this manner, has timings for the output B1 output by the flip-flops 2a, 3a switching from L to H and switching from H to L that differ from those of the output B2 output by the flip-flops 2b, 3b. This accordingly means that there is misalignment between the phases of the outputs B1, B2. This is because the flip-flop 2a is able to receive and take in the output A at the rise timing of the clock B the instant the output A has changed, but the flip-flop 2b is not able to receive and take in the output A at the rise timing of the clock B the instant the output A has changed, and instead receives and takes in the output A at the next rise timing of the clock B.

Thus in cases in which flip-flops are employed to generate two outputs from a single input, the circuit illustrated in FIG. 9 is not always able to synchronize the phases of the two outputs. This means that the circuit illustrated in FIG. 9 is not appropriately employed as a circuit that receives and operates under two outputs in cases in which synchronization is required.

The inventors of the present disclosure have therefore performed diligent investigations into technology to synchronize the phases of two outputs in cases in which two outputs are generated from a single input by employing flip-flops. As a result the inventors of the present disclosure have invented a technology to synchronize the phases of two outputs using logical operations in cases in which two outputs are generated from a single input by employing flip-flops.

First Exemplary Embodiment

FIG. 1 is a diagram illustrating an example of a clock synchronization circuit 10a according to a first exemplary embodiment of the present disclosure. The clock synchronization circuit 10a illustrated in FIG. 1 is configured by a signal generation circuit section 20 and a synchronization circuit section 30a.

The signal generation circuit section 20 is configured from flip-flops 21, 22a, 22b, 23a, 23b. The flip-flops 21, 22a, 22b, 23a, 23b are respective examples of a first logic circuit, a second logic circuit, a third logic circuit, a fourth logic circuit, and a fifth logic circuit. The flip-flops 22a, 22b, 23a, 23b are an example of a logic circuit section. Operation of the signal generation circuit section 20 is similar to the operation of the signal generation circuit as explained using FIG. 9 and FIG. 10. The flip-flop 21 receives and operates under the clock A, and generates output A from the input. The flip-flops 22a, 22b are input with the output A generated by the flip-flop 21, receive the clock B that is different from the clock A, and respectively output the outputs B1_pre, B2_pre. The flip-flops 23a, 23b are respectively input with the outputs B1_pre, B2_pre, receive the clock B that is different from the clock A, and respectively output the outputs B1_q, B2_q. The clock A and clock B are respective examples of a first clock and a second clock. The outputs B1_q, B2_q are respective examples of a first signal and a second signal.

The synchronization circuit section 30a is a circuit to output the outputs B1, B2 from the outputs B1_q, B2_q output from the signal generation circuit section 20. The synchronization circuit section 30a is a circuit that performs logical operations capable of controlling the phases of the outputs B1_q, B2_q, enabling the phase of the output B1 and the phase of the output B2 to be aligned and output. The synchronization circuit section 30a is configured from AND circuits 31a, 31b, and from OR circuits 32a, 32b.

The AND circuit 31a takes a logical product of output B1_q and a synchronization enabling signal EN, and outputs this as output B1_en. The AND circuit 31b takes a logical product of output B2_q and the synchronization enabling signal EN, and outputs this as output B2_en. The AND circuits 31a, 31b are respective examples of a first AND circuit and a second AND circuit.

The OR circuit 32a takes a logical sum of the output B1_q and the output B2_en from the AND circuit 31b and outputs the output B1. The OR circuit 32b takes a logical sum of the output B2_q and the output B1_en from the AND circuit 31a and outputs the output B2. The OR circuits 32a, 32b are respective examples of a first OR circuit and a second OR circuit.

The synchronization enabling signal EN is a signal for adjusting the phase of the output B1 with the phase of the output B2. The synchronization enabling signal EN is generated by a non-illustrated signal generation circuit, and is supplied to the synchronization circuit section 30a. The signal generation circuit for generating the synchronization enabling signal EN may be formed in the clock synchronization circuit 10a, or may be formed outside the clock synchronization circuit 10a. Note that the synchronization enabling signal EN may be expressed as being a signal for adjusting the phases of the output B1_q and the output B2_q.

The synchronization enabling signal EN is made active and a VDD level, i.e. "1", is input in cases in which there is a desire to correct misalignment between the phase of the output B1 and the phase of the output B2. The synchronization enabling signal EN is deactivated and GND level, i.e. "0", is input in cases in which misalignment between the phase of the output B1 and the phase of the output B2 is not to be corrected. The VDD level is a high voltage level, and the GND level is a low voltage level such as a ground contact voltage. VDD and GND are respective examples of a first voltage and a second voltage.

In cases in which the synchronization enabling signal EN is active, i.e. "1", the synchronization circuit section 30a aligns the phases of the outputs B1, B2 before output, and in cases in which the synchronization enabling signal EN is inactive. i.e. "0", the synchronization circuit section 30a outputs the outputs B1_q, B2_q without changing the phases of the outputs B1, B2.

Figure 2:
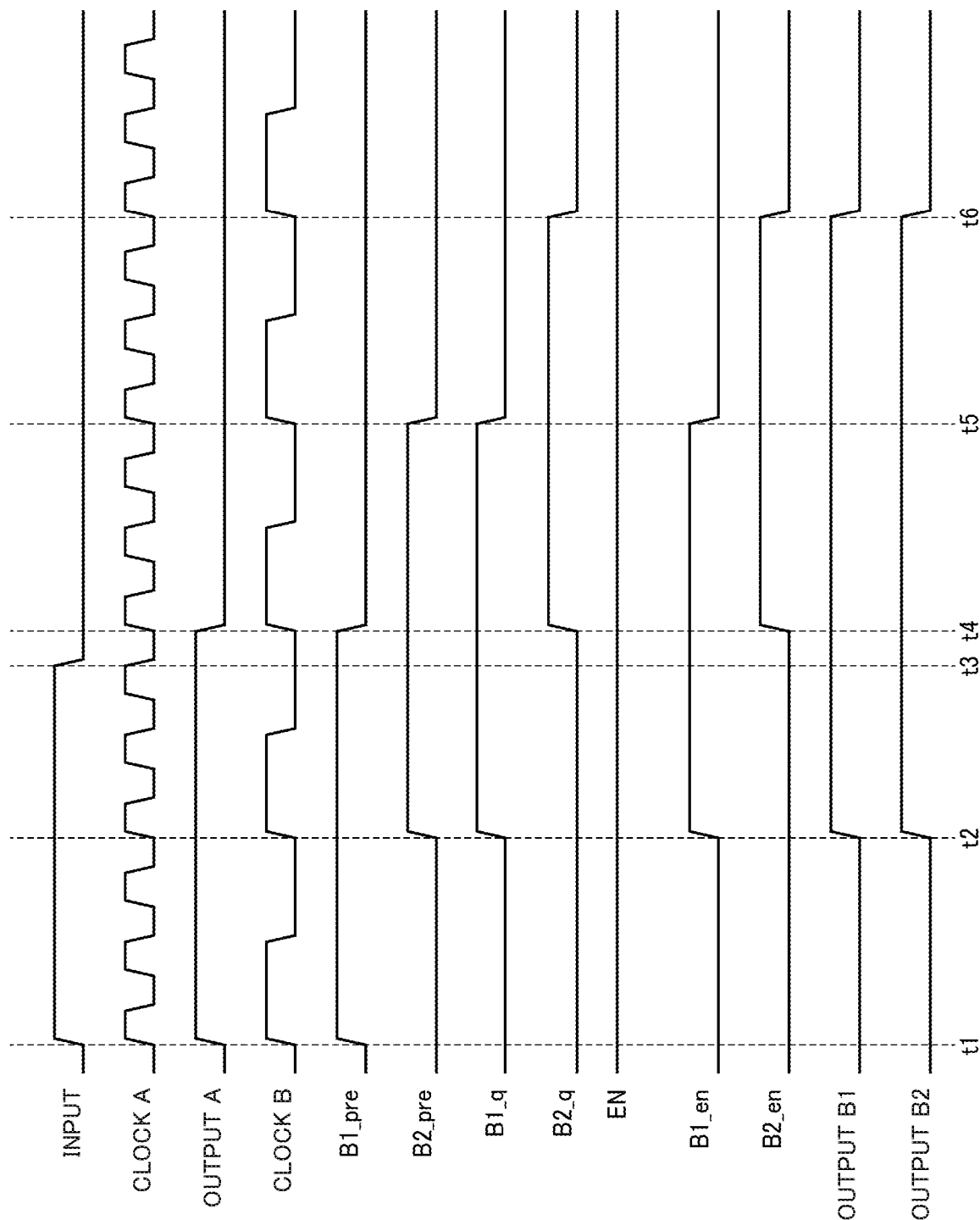
FIG. 2 is a timing chart to explain operation of the clock synchronization circuit illustrated in FIG. 1.

FIG. 2 is a timing chart to explain operation of the clock synchronization circuit 10a illustrated in FIG. 1.

The flip-flop 21 receives and operates under the clock A, and when the input transitions from L to H at the point in time t1, the flip-flop 21 changes the output A from L to H at a switching timing of the clock A from L to H and outputs the output A. The input transitions from H to L at time t3 later than time t1. Note that the switching of the input from H to L is not performed instantaneously, and requires a specific period of time.

When the input transitions from H to L at time t3, the flip-flop 21 changes the output A from H to L at the point in time t4 when the clock A next switches from L to H, and outputs the output A.

The flip-flop 22a that receives and operates under the clock B is input with the output A, and changes an output B1_pre from L to H at a switching timing of the output A from L to H, i.e. at time t1, and outputs the output B1_pre. The flip-flop 23a that receives and operates under the same clock B is input with the output B1_pre, and changes an output B1_q from L to H at time t2 one cycle of the clock B from after the output B1_pre has switched from L to II, and outputs the output B1_q.

The flip-flop 22a then changes the output B1_pre from H to L at a switching timing of the output A from H to L, i.e. at time t4, and outputs the output B1_pre. The flip-flop 23a changes the output B1_q from H to L at the time t5 one cycle of the clock B from after the output B1_pre has switched from H to L, and outputs the outputs B1_q. Reference here to one cycle means, for example, a period from time t1 to time t2 under the clock B that is a period from when the clock starts to transition from L to H in until the clock next starts to transition from L to H.

The flip-flop 22b that similarly receives and operates under the clock B is input with output A and changes the output B2_pre from L to H not at time t1 that is the switching timing of the output A from L to H, but instead at time t2 one cycle of the clock B from after the output B1_pre has switched from L to H, and outputs the output B2_pre. The flip-flop 23b that similarly receives and operates under the clock B is input with the output B2_pre and changes the output B2_q from L to H at time t4 one cycle of the clock B from after the output B1_pre has switched from L to H, and outputs the output B2_q.

The flip-flop 22b changes the output B2_pre from H to L at time t5 one cycle of the clock B from after the output A has switched from H to L and outputs the output B2_pre. The flip-flop 23b changes the output B2_q from H to L at time t6 one cycle of the clock B from after the output B2_pre has switched from II to L and outputs the output B2_q.

In FIG. 2, the synchronization enabling signal EN is "1" (H) for all periods of time to align the phase of the output B1 and the phase of the output B2. The AND circuit 31a outputs the output B1_en at H only in cases in which the two signals input are both H. Similarly, the AND circuit 31b outputs the output B2_en at H only in cases in which the two signals input are both H. In FIG. 2, the AND circuit 31a outputs the output B1_en at H for the interval from time t2 to time t5. The AND circuit 31b outputs the output B2_en at H for the interval from time t4 to time t6.

The OR circuit 32a outputs the output B1 at H in cases in which any of the two input signals is H. Namely, the OR circuit 32a outputs the output B1 at H for the interval when any of the output B1_q or the output B2_en is H.

Similarly, the OR circuit 32b outputs the output B2 at H in cases in which any of the two input signals is H. Namely, the OR circuit 32b outputs the output B2 at H for the interval any of the output B2_q or the output B1_en is H.

In FIG. 2 the OR circuit 32a outputs the output B1 at H for the interval from time t2 to time t6, and the OR circuit 32b also outputs the output B2 at H for the interval from time t2 to time t6.

Thus as illustrated in FIG. 2, the synchronization circuit section 30a is able to output the outputs B1, B2 at H for the period of time in which any of the outputs B1_q, B2_q is H even in cases in which there is misalignment between the phases of the outputs B1_q, B2_q. Namely, the synchronization circuit section 30a is able to output the two outputs B1, B2 synchronized in phase.

As described above, the clock synchronization circuit 10a of the present exemplary embodiment is able to generate the outputs B1, B2 synchronized in phase due to provision of the synchronization circuit section 30a.

Moreover, the clock synchronization circuit 10a of the present exemplary embodiment is able to output the outputs B1, B2 at H at times when any of the outputs B1_q, B2_q is at H due to provision of the OR circuits 32a, 32b as the synchronization circuit section 30a. This thereby enables the timing of change of the outputs B1, B2 from L to H to be brought forward, and enables the active width that is the width when the outputs B1, B2 are at H to be lengthened. Thus the clock synchronization circuit 10a of the present exemplary embodiment is able to supply signals with early rise timing to a non-illustrated later stage circuit input with the outputs B1, B2.

Second Exemplary Embodiment

Figure 3:
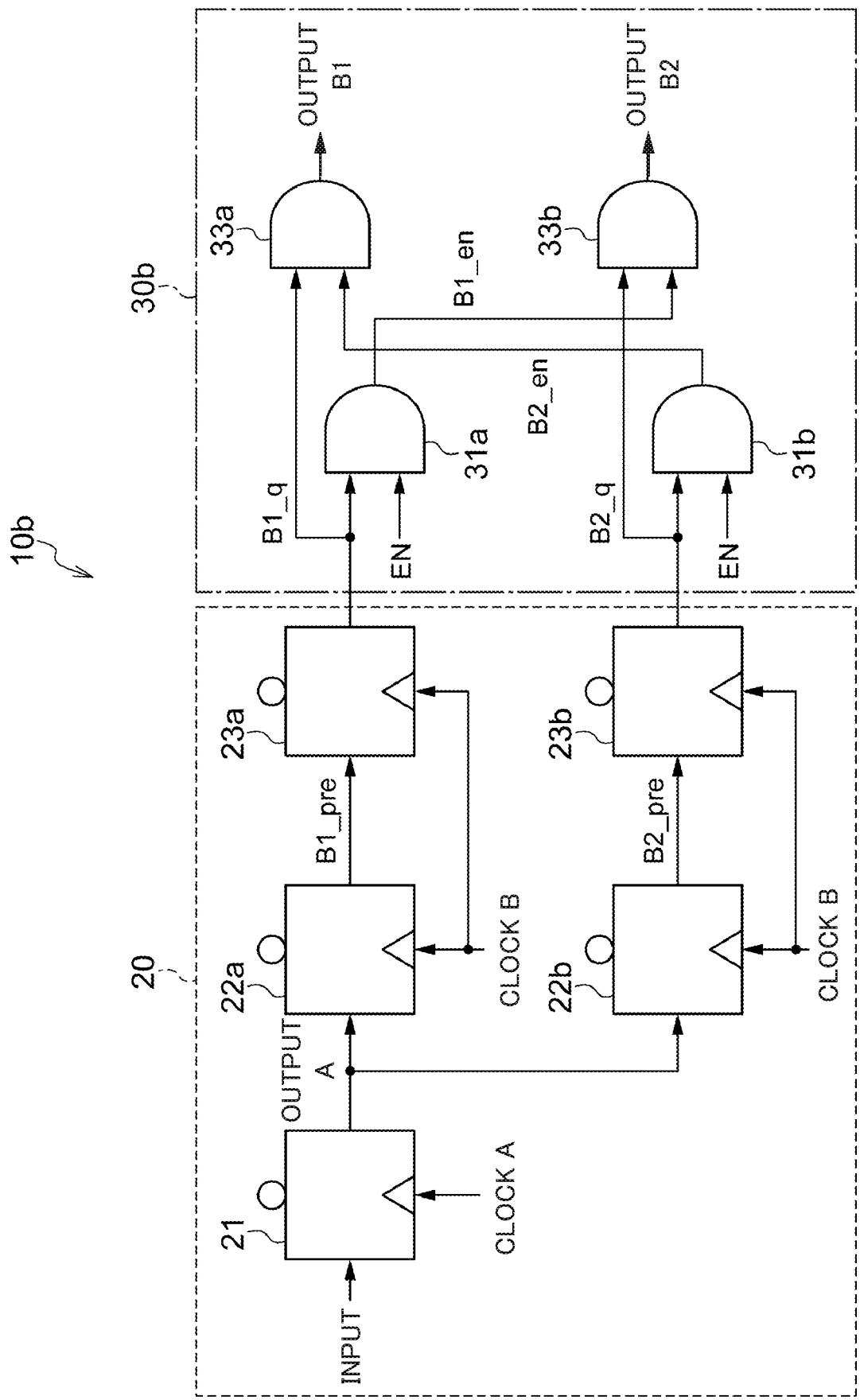
FIG. 3 is a diagram illustrating an example of a clock synchronization circuit according to a second exemplary embodiment of the present disclosure.

FIG. 3 is a diagram illustrating an example of a clock synchronization circuit 10b according to a second exemplary embodiment of the present disclosure. The clock synchronization circuit 10b illustrated in FIG. 3 includes the signal generation circuit section 20 and a synchronization circuit section 30b.

The configuration and operation of the signal generation circuit section 20 is similar to that of the first exemplary embodiment, and so detailed explanation thereof will be omitted.

The synchronization circuit section 30b is a circuit to output the outputs B1, B2 from outputs B1_q, B2_q output from the signal generation circuit section 20. The synchronization circuit section 30b is a circuit that performs logical operations capable of controlling the phases of the outputs B1_q, B2_q, and enables the phases of the outputs B1, B2 to be aligned and output. The synchronization circuit section 30b includes AND circuits 31a, 31b, 33a, 33b. The synchronization circuit section 30b according to the second exemplary embodiment has a configuration in which the AND circuits 33a, 33b are substituted for the OR circuits 32a, 32b of the synchronization circuit section 30a according to the first exemplary embodiment. Namely, the AND circuit 33a takes a logical product of the output B1_q and the output B2_en from the AND circuit 31b, and outputs the output B1. The AND circuit 33b takes a logical product of the output B2_q and the output B1_en from the AND circuit 31a and outputs the output B2. The AND circuits 33a, 33b are respective examples of a third AND circuit and a fourth AND circuit.

The synchronization enabling signal EN is generated by a non-illustrated signal generation circuit and supplied to the synchronization circuit section 30b. The signal generation circuit for generating the synchronization enabling signal EN may be formed in the clock synchronization circuit 10b, or may be formed outside the clock synchronization circuit 10b.

Figure 4:
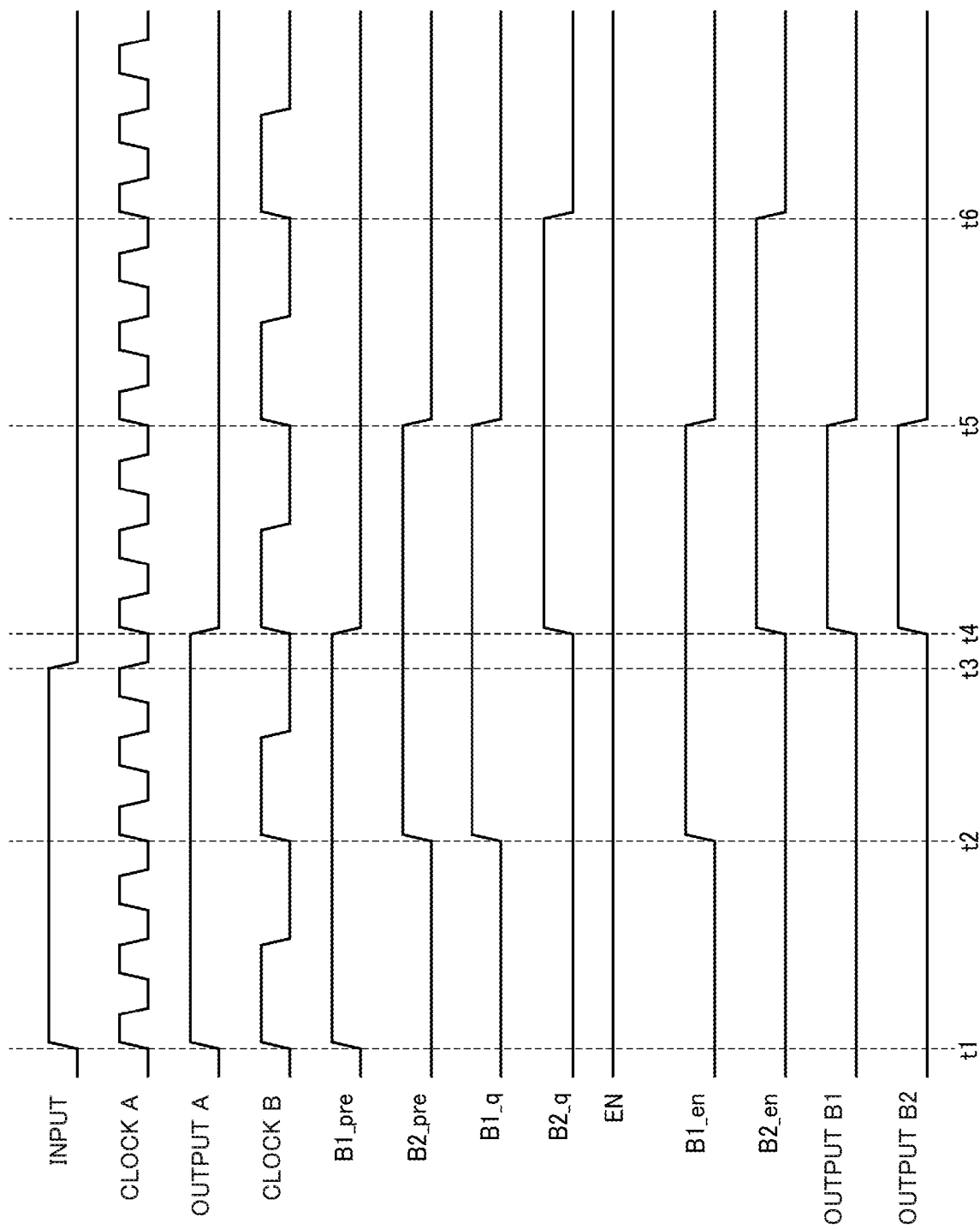
FIG. 4 is a timing chart to explain operation of the clock synchronization circuit illustrated in FIG. 3.

FIG. 4 is a timing chart to explain operation of the clock synchronization circuit 10b illustrated in FIG. 3.

As described above, the synchronization circuit section 30b according to the second exemplary embodiment has a configuration in which the AND circuits 33a, 33b are substituted for the OR circuits 32a, 32b of the synchronization circuit section 30a according to the first exemplary embodiment. Thus explanation follows regarding changes in the operation from that of the first exemplary embodiment due to substitution with the AND circuits 33a, 33b.

The AND circuit 33a outputs the output B1 at H in cases in which both the two signals input is H. Namely, the AND circuit 33a outputs the output B1 at H for the interval of time when both the output B1_q and the output B2_en are H.

Similarly, the AND circuit 33b outputs the output B1 at H in cases in which both the two signals input are H. Namely, the AND circuit 33b outputs the output B2 at H for the interval of time when both the output B2_q and the output B1_en are H.

The AND circuit 33a in FIG. 4 outputs the output B1 at H for the interval from time t4 to time t5, and the AND circuit 33b also outputs the output B2 at H for the interval from time t4 to time t5.

Thus the synchronization circuit section 30b is, as illustrated in FIG. 4, able to output the outputs B1, B2 at H for the interval during which both the outputs B1_q, B2_q are H even in cases in which there is misalignment between the phases of the outputs B1_q, B2_q. Namely, the synchronization circuit section 30b is able to output the two outputs B1, B2 synchronized in phase.

As described above, the clock synchronization circuit 10b of the present exemplary embodiment is able to generated the outputs B1, B2 synchronized in phase due to provision of the synchronization circuit section 30b.

Moreover, the clock synchronization circuit 10b of the present exemplary embodiment is able to output the outputs B1, B2 at H when both outputs B1_q, B2_q are at H due to provision of the AND circuits 33a, 33b as the synchronization circuit section 30b. This thereby enables the timing of change of the outputs B1_q, B2_q from H to L to be brought forward, enabling the active width that is the width when the outputs B1, B2 are at H to be prevented from being prolonged. Thus the clock synchronization circuit 10b according to the present exemplary embodiment is able to supply signals with early fall timing to a non-illustrated later stage circuit input with the outputs B1, B2.

Third Exemplary Embodiment

Figure 5:
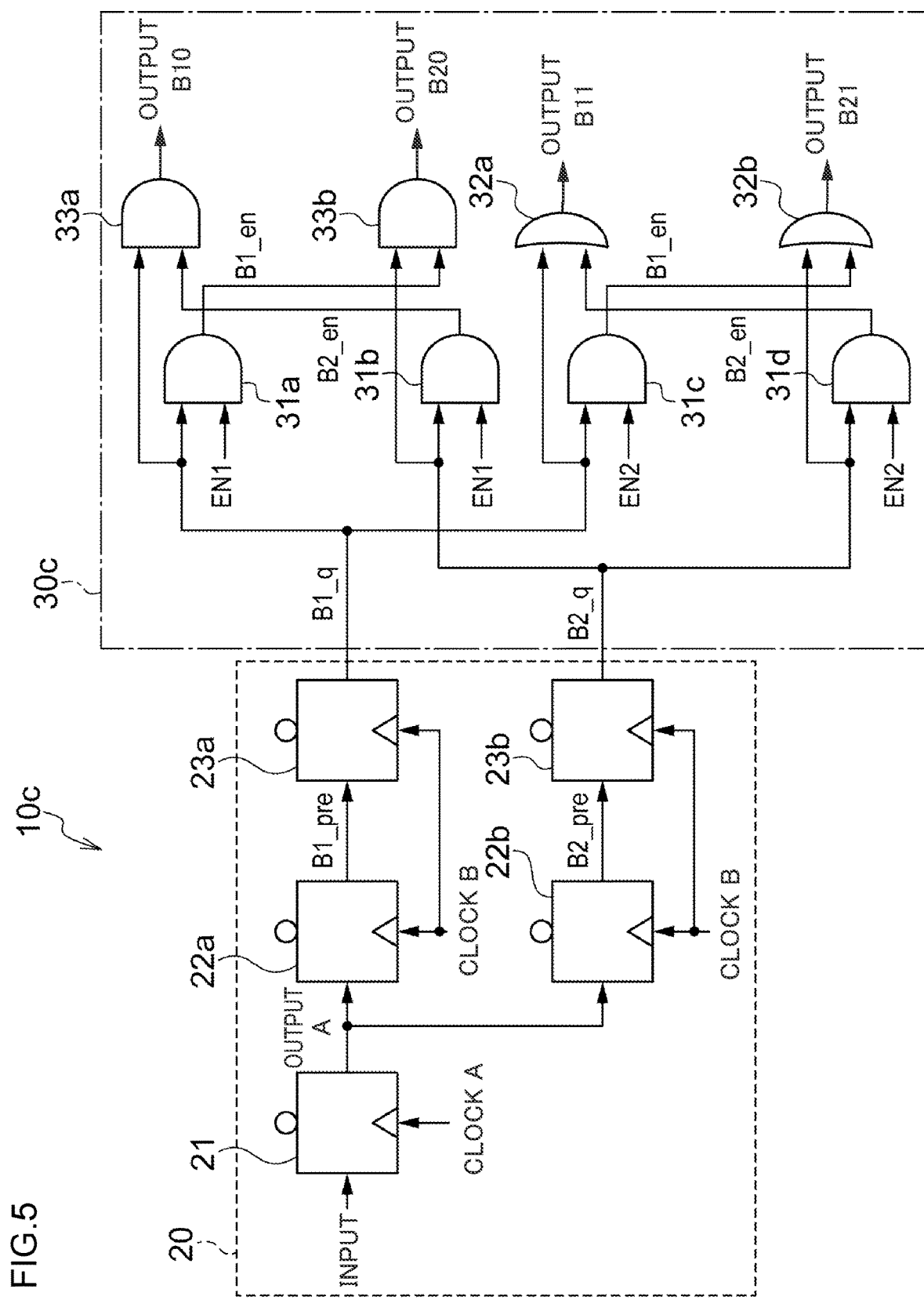
FIG. 5 is a diagram illustrating an example of a clock synchronization circuit according to a third exemplary embodiment of the present disclosure.

FIG. 5 is a diagram illustrating an example of a clock synchronization circuit 10c according to a third exemplary embodiment of the present disclosure. The clock synchronization circuit 10c illustrated in FIG. 5 is configured by a signal generation circuit section 20 and a synchronization circuit section 30c.

The configuration and operation of the signal generation circuit section 20 is similar to that of the first exemplary embodiment, and so detailed explanation thereof will be omitted.

The synchronization circuit section 30c is a circuit to output the outputs B10, B20, B11, B21 from outputs B1_q, B2_q output from the signal generation circuit section 20. The synchronization circuit section 30c is a circuit that performs logical operations capable of controlling the phases of the outputs B1_q, B2_q, logical operations capable of aligning the phases of the outputs B10, B20 when output, and logical operations capable of aligning the phases of the outputs B11, B21 when output. The synchronization circuit section 30c includes AND circuits 31a, 31b, 31c, 31d, 33a, 33b and OR circuits 32a, 32b. The synchronization circuit section 30c according to the third exemplary embodiment has a configuration combining the configuration of the synchronization circuit section 30a according to the first exemplary embodiment with the configuration of the synchronization circuit section 30b according to the second exemplary embodiment.

The AND circuit 31a takes a logical product of the output B1_q and an synchronization enabling signal EN1 and outputs an output B1_en. The AND circuit 31b takes a logical product of the output B2_q and the synchronization enabling signal EN1 and outputs an output B2_en. The AND circuit 33a takes a logical product of the output B1_q and the output B2_en from the AND circuit 31b and outputs the output B10. The AND circuit 33b takes a logical product of the output B2_q and the output B1_en from the AND circuit 31a and outputs the output B20. The AND circuits 31a, 31b, 33a, 33b are respective examples of a first AND circuit, a second AND circuit, a third AND circuit, and a fourth AND circuit.

The AND circuit 31c takes a logical product of the output B1_q and a synchronization enabling signal EN2 and outputs the output B1_en. The AND circuit 31d takes a logical product of the output B2_q and the synchronization enabling signal EN2 and outputs the output B2_en. The OR circuit 32a takes a logical sum of the output B1_q and the output B2_en from the AND circuit 31d and outputs an output B11. The OR circuit 32b takes a logical sum of the output B2_q and the output B1_en from the AND circuit 31c and outputs an output B21. The AND circuits 31c, 31d are respective examples of a fifth AND circuit and a sixth AND circuit. The OR circuits 32a, 32b are respective examples of a first OR circuit and a second OR circuit.

The synchronization enabling signal EN1 and the synchronization enabling signal EN2 are signals for adjusting the phase of the output B10 and the phase of the output B20, and the phase of the output B11 and the phase of the output B21. The synchronization enabling signal EN1 and the synchronization enabling signal EN2 are generated by a non-illustrated signal generation circuit, and supplied to the synchronization circuit section 30c. The signal generation circuit for generating the synchronization enabling signal EN1 and the synchronization enabling signal EN2 may be formed in the clock synchronization circuit 10c or may be formed outside the clock synchronization circuit 10c. Moreover, the synchronization enabling signal EN1 and the synchronization enabling signal EN2 may be generated as the same signal, or may be generated as different signals. The synchronization enabling signal EN1 and the synchronization enabling signal EN2 may be expressed as being signals for adjusting the phases of the output B1_q and the output B2_q.

For the synchronization enabling signal EN1, the synchronization enabling signal EN1 is active and VDD level of "1" is input in cases in which misalignment between the phase of the output B10 and the phase of the output B20 is to be corrected, and the synchronization enabling signal EN1 is inactive and GND level of "0" is input in cases in which phase misalignment is not to be corrected. The synchronization enabling signal EN1 is an example of a first synchronization enabling signal.

For the synchronization enabling signal EN2, the synchronization enabling signal EN2 is active and VDD level of "1" is input in cases in which misalignment between the phase of the output B11 and the phase of the output B21 is to be corrected, and the synchronization enabling signal EN2 is inactive and GND level of "0" is input in cases in which phase misalignment is not to be corrected. The synchronization enabling signal EN2 is an example of a second synchronization enabling signal.

Figure 6:
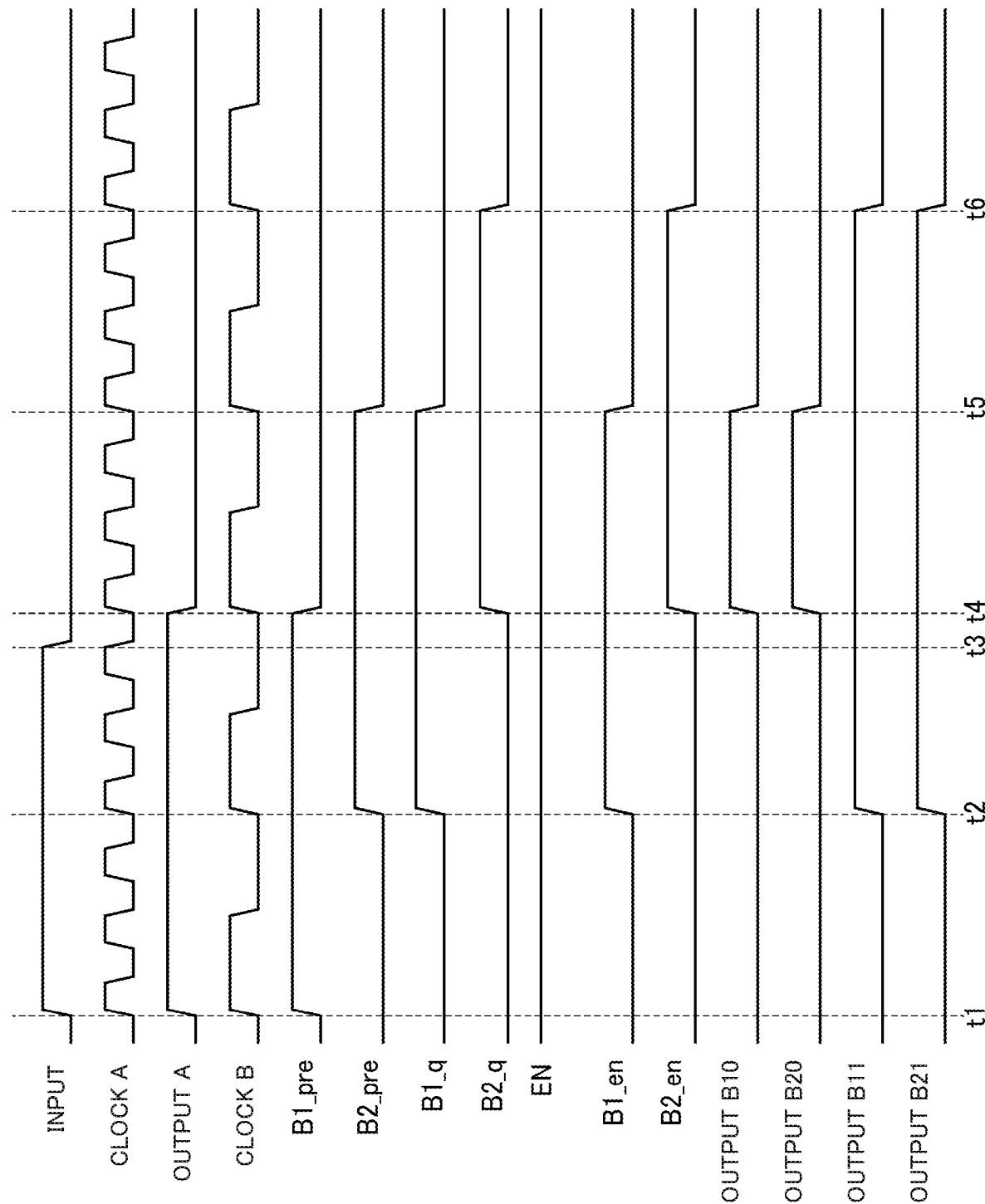
FIG. 6 is a timing chart to explain operation of the clock synchronization circuit illustrated in FIG. 5.

FIG. 6 is a timing chart to explain operation of the clock synchronization circuit 10c illustrated in FIG. 5.

As described above, the synchronization circuit section 30c according to the third exemplary embodiment has a configuration combining the configuration of the synchronization circuit section 30a according to the first exemplary embodiment with the configuration synchronization circuit section 30b according to the second exemplary embodiment. Thus explanation follows regarding changes from the operation of the first exemplary embodiment due to substitution with the synchronization circuit section 30c.

In FIG. 6, the synchronization enabling signal EN1 is at "1" (H) for the entire period of time in order to align the phase of the output B10 and the phase of the output B20, and the synchronization enabling signal EN2 is at "1" (H) for the entire period of time in order to align the phase of the output B11 and the phase of the output B21.

The AND circuit 33a outputs the output B10 at H in cases in which both of the two signals input are H. Namely, the AND circuit 33a outputs the output B10 at H for the interval of time when both of the output B1_q and the output B2_en are H.

Similarly, the AND circuit 33b outputs the output B20 at H in cases in which both of the two signals input are H. Namely, the AND circuit 33b outputs the output B20 at H for the interval of time when both of the output B2_q and the output B1_en are H.

Moreover, the OR circuit 32a outputs the output B11 at II in cases in which any of the two signals input is H. Namely, the OR circuit 32a outputs the output B11 at H for the interval of time when any of the output B1_q or the output B2_en is H.

Similarly, the OR circuit 32b outputs the output B21 at H in cases in which any of the two signals input is H. Namely, the OR circuit 32b outputs the output B21 at H for the interval of time when any of the output B2_q or the output B1_en is H.

In FIG. 6, the AND circuit 33a outputs the output B10 at H for the interval from time t4 to time t5, and the AND circuit 33b also outputs the output B20 at H for the interval from time t4 to time t5. Moreover, the OR circuit 32a outputs the output B11 at H for the interval from time t2 to time t6, and the OR circuit 32b also outputs the output B21 at H for the interval from time t2 to time t6.

Thus the synchronization circuit section 30c is, as illustrated in FIG. 6, able to output the outputs B10, B20 at H for the period of time when outputs B1_q, B2_q are both H even in cases in which there is misalignment between the phases of the outputs B1_q, B2_q. Namely, the synchronization circuit section 30c is able to output the two outputs B10, B20 synchronized in phase.

Moreover, the synchronization circuit section 30c is, as illustrated in FIG. 6, able to output the outputs B11, B21 at H for the period of time when any of the outputs B1_q, B2_q is H even in cases in which there is misalignment between the phases of the outputs B1_q, B2_q. Namely, the synchronization circuit section 30c is able to output the two outputs B11, B21 synchronized in phase.

As described above, the clock synchronization circuit 10c of the present exemplary embodiment is able to generate the outputs B10, B20 and the outputs B11, B21 synchronized in phase due to provision of the synchronization circuit section 30c that combines the configuration of the synchronization circuit section 30a according to the first exemplary embodiment with the configuration of the synchronization circuit section 30b according to the second exemplary embodiment.

Moreover, the synchronization circuit section 30c includes the advantages of both the first exemplary embodiment and the second exemplary embodiment due to being configured by combining the configuration of the synchronization circuit section 30a according to the first exemplary embodiment with the configuration of the synchronization circuit section 30b according to the second exemplary embodiment. The outputs supplied to a non-illustrated later stage circuit are accordingly selectable from the outputs B10, B20 and the outputs B11, B21. More specifically, the active synchronization enabling signal EN1 may be made active and the outputs B10, B20 selected for cases in which outputs supplied to the later stage circuit need to be outputs having an early rise and long active width, and the active synchronization enabling signal EN2 may be made active and the outputs B11, B21 selected for cases for cases in which outputs need to have an early fall without a prolonged active width.

Explanation next follows regarding an example of a configuration of a semiconductor device employing the clock synchronization circuit of the first exemplary embodiment to the third exemplary embodiment.

Figure 7:
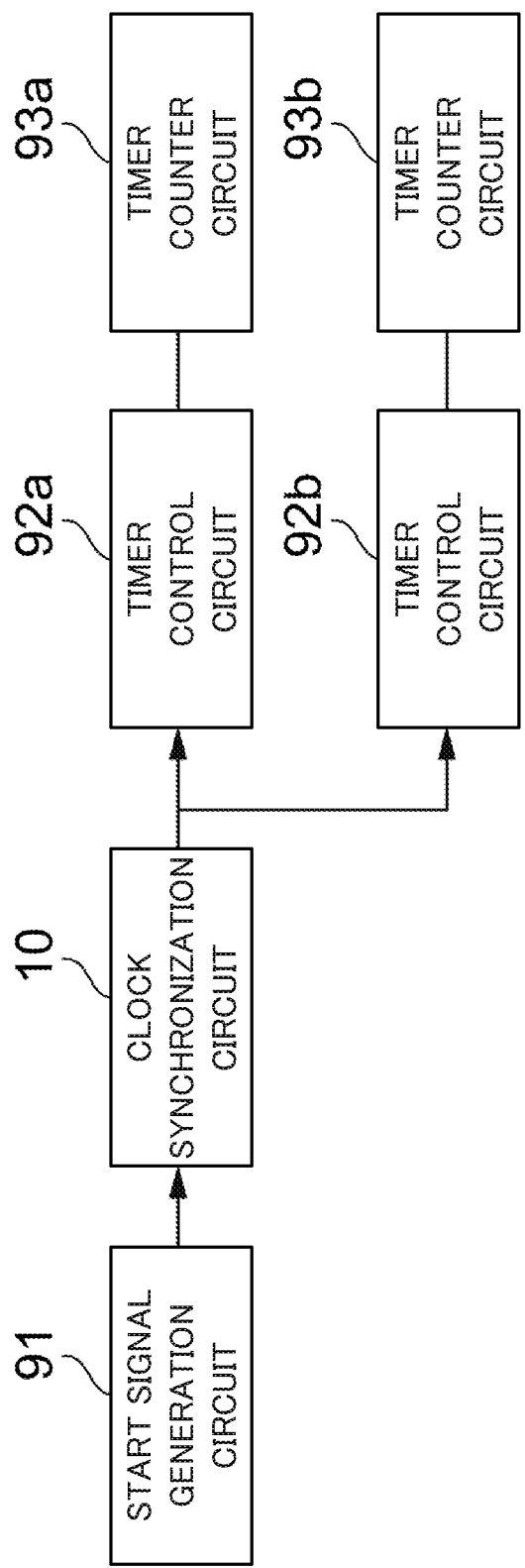
FIG. 7 is a diagram illustrating an example of a configuration of a semiconductor device employing a clock synchronization circuit of the first exemplary embodiment to the third exemplary embodiment.

FIG. 7 is a diagram illustrating an example of a configuration of a semiconductor device 90 employing the clock synchronization circuit of the first exemplary embodiment to the third exemplary embodiment. The semiconductor device 90 illustrated in FIG. 7 includes a start signal generation circuit 91, a clock synchronization circuit 10, timer control circuits 92a, 92b, and timer counter circuits 93a, 93b. The clock synchronization circuit 10 is the clock synchronization circuit for any one of the first exemplary embodiment to the third exemplary embodiment.

The start signal generation circuit 91 generates a specific start signal and supplies this to the clock synchronization circuit 10. The timer control circuits 92a, 92b are circuits to control the respective operation of the timer counter circuits 93a, 93b based on signals generated by the clock synchronization circuit 10 and synchronized in phase. The timer counter circuits 93a, 93b are circuits to count a timer under control from the timer control circuits 92a, 92b.

The semiconductor device 90 illustrated in FIG. 7 is able to match the values of the timer as counted by the timer counter circuits 93a, 93b due to including the clock synchronization circuit 10 capable of synchronizing the phases of the two outputs.

Note that although the semiconductor device is illustrated in FIG. 7 includes timer counter circuits to count a timer based on the signals output by a clock synchronization circuit, the present disclosure is not limited to such an example. The semiconductor device may be any semiconductor device including a circuit with synchronous operation based on signals output by the clock synchronization circuit, and is not limited to the semiconductor device illustrated in FIG. 7.

As described above, the exemplary embodiments of the present disclosure enable provision of a clock synchronization circuit to convert circuit outputs that have an asynchronous relationship into outputs that have a synchronous relationship in cases in which there is a desire to synchronously control circuits having an asynchronous relationship by performing logical operations with a synchronization enabling signal. Moreover, this exemplary embodiment of the present disclosure provides a semiconductor device including a circuit with synchronous operation based on signals output by a clock synchronization circuit.

An object of the present disclosure is to provide a clock synchronization circuit, semiconductor device, and clock synchronization method to convert circuit outputs having an asynchronous relationship to outputs having a synchronous relationship in cases in which there is a desire to synchronously control circuits having an asynchronous relationship.

A first aspect of the present disclosure is a clock synchronization circuit that includes a signal generation circuit configured to generate a first signal and a second signal by receiving a signal output under a first clock with two logic circuits that respectively operate under a second clock that is different from the first clock, and a synchronization circuit configured to receive the first signal, the second signal, and a synchronization enabling signal for adjusting phases of the first signal and the second signal, and control the phases of the first signal and the second signal using a first output result from a logical operation performed on the second signal and on a result of a logical operation with the first signal and the synchronization enabling signal, and using a second output result from a logical operation performed on the first signal and on a result of a logical operation with the second signal and the synchronization enabling signal.

A second aspect of the present disclosure is the clock synchronization circuit of the first aspect, wherein the synchronization circuit includes a first AND circuit taking a logical product of the first signal and the synchronization enabling signal; a second AND circuit taking a logical product of the second signal and the synchronization enabling signal; a first OR circuit taking a logical sum of the first signal and an output of the second AND circuit; and a second OR circuit taking a logical sum of the second signal and an output of the first AND circuit.

A third aspect of the present disclosure is the clock synchronization circuit of the first aspect, wherein the synchronization circuit includes a first AND circuit taking a logical product of the first signal and the synchronization enabling signal; a second AND circuit taking a logical product of the second signal and the synchronization enabling signal; a third AND circuit taking a logical product of the first signal and an output of the second AND circuit; and a fourth AND circuit taking a logical product of the second signal and an output of the first AND circuit.

A fourth aspect of the present disclosure is the clock synchronization circuit of the first aspect, wherein the synchronization circuit outputs the first signal and the second signal aligned in phase in a case in which the synchronization enabling signal is active, and outputs the first signal and the second signal unchanged in phase in a case in which the synchronization enabling signal is inactive.

A fifth aspect of the present disclosure is the clock synchronization circuit of the fourth aspect, wherein the synchronization enabling signal is a signal of a first voltage in a case in which the synchronization enabling signal is active, and the synchronization enabling signal is a signal of a second voltage different from the first voltage in a case in which the synchronization enabling signal is inactive.

A sixth aspect of the present disclosure is the clock synchronization circuit of the first aspect, wherein the signal generation circuit includes a first logic circuit configured to operate under the first clock; a second logic circuit configured to receive a signal output from the first logic circuit and to operate under the second clock; a third logic circuit in parallel to the second logic circuit and configured to receive the signal output from the first logic circuit and to operate under the second clock; a fourth logic circuit configured to receive a signal output from the second logic circuit, to operate under the second clock, and to generate the first signal; and a fifth logic circuit configured to receive a signal output from the third logic circuit, to operate under the second clock, and to generate the second signal.

A seventh aspect of the present disclosure is a clock synchronization circuit that includes a signal generation circuit configured to receive a signal output under a first clock with two logic circuits respectively operating under a second clock that is different from the first clock, and to generate a first signal and a second signal; a first synchronization circuit configured to receive the first signal, the second signal, and a first synchronization enabling signal for adjusting phases of the first signal and the second signal, and control the phases of the first signal and the second signal using a first output result from a logical operation performed on the second signal and on a result of a logical operation with the first signal and the first synchronization enabling signal, and using a second output result from a logical operation performed on the first signal and on a result of a logical operation with the second signal and the first synchronization enabling signal; and a second synchronization circuit configured to receive the first signal, the second signal, and a second synchronization enabling signal for adjusting phases of the first signal and the second signal, and control the phases of the first signal and the second signal using a third output result from a logical operation performed on the second signal and on a result of a logical operation with the first signal and the second synchronization enabling signal, and using a fourth output result from a logical operation performed on the first signal and on a result of a logical operation with the second signal and the second synchronization enabling signal.

An eighth aspect of the present disclosure is the clock synchronization circuit of the seventh aspect, wherein the first synchronization circuit further includes a first AND circuit taking a logical product of the first signal and the first synchronization enabling signal, a second AND circuit taking a logical product of the second signal and the first synchronization enabling signal, a third AND circuit taking a logical product of the first signal and an output of the second AND circuit, and a fourth AND circuit taking a logical product of the second signal and an output of the first AND circuit; and the second synchronization circuit comprises a fifth AND circuit taking a logical product of the first signal and the second synchronization enabling signal, a sixth AND circuit taking a logical product of the second signal and the second synchronization enabling signal, a first OR circuit taking a logical sum of the first signal and an output of the sixth AND circuit, and a second OR circuit taking a logical sum of the second signal and an output of the fifth AND circuit.

A ninth aspect of the present disclosure is the clock synchronization circuit of the seventh aspect, wherein the first synchronization circuit outputs the first signal and the second signal aligned in phase in a case in which the first synchronization enabling signal is active, and outputs the first signal and the second signal unchanged in phase in a case in which the first synchronization enabling signal is inactive, and the second synchronization circuit outputs the first signal and the second signal aligned in phase in a case in which the second synchronization enabling signal is active, and outputs the first signal and the second signal unchanged in phase in a case in which the second synchronization enabling signal is inactive.

A tenth aspect of the present disclosure is the clock synchronization circuit of the ninth aspect, wherein the first synchronization enabling signal is a signal of a first voltage in a case in which the first synchronization enabling signal is active, and the first synchronization enabling signal is a signal of a second voltage different from the first voltage in a case in which the first synchronization enabling signal is inactive, and the second synchronization enabling signal is a signal of the first voltage in a case in which the second synchronization enabling signal is active, and the second synchronization enabling signal is a signal of the second voltage in a case in which the second synchronization enabling signal is inactive.

An eleventh aspect of the present disclosure is the clock synchronization circuit of the seventh aspect, wherein the signal generation circuit includes a first logic circuit configured to operate under the first clock; a second logic circuit configured to receive a signal output from the first logic circuit and to operate under the second clock; a third logic circuit in parallel to the second logic circuit and configured to receive the signal output from the first logic circuit and to operate under the second clock; a fourth logic circuit configured to receive a signal output from the second logic circuit, to operate under the second clock, and to generate the first signal; and a fifth logic circuit configured to receive a signal output from the third logic circuit, to operate under the second clock, and to generate the second signal.

A twelfth aspect of the present disclosure is the clock synchronization circuit of the eleventh aspect, wherein the first logic circuit, the second logic circuit, the third logic circuit, the fourth logic circuit, and the fifth logic circuit are flip-flops.

A thirteenth aspect of the present disclosure is a semiconductor device that includes a signal output circuit configured to output a signal; the clock synchronization circuit of the first aspect configured to generate at least two signals based on the signal output by the signal output circuit; and a control circuit configured to operate based on the signals generated by the clock synchronization circuit.

A fourteenth aspect of the present disclosure is a semiconductor device that includes a signal output circuit configured to output a signal; the clock synchronization circuit of the seventh aspect configured to generate at least two signals based on the signal output by the signal output circuit; and a control circuit configured to operate based on the signals generated by the clock synchronization circuit.

A fifteenth aspect of the present disclosure is a clock synchronization method that includes generating a first signal and a second signal by receiving a signal output under a first clock with two logic circuits that respectively operate under a second clock that is different from the first clock, receiving the first signal, the second signal, and a synchronization enabling signal for adjusting phases of the first signal and the second signal, and controlling the phases of the first signal and the second signal using a first output result from a logical operation performed on the second signal and on a result of a logical operation with the first signal and the synchronization enabling signal, and using a second output result from a logical operation performed on the first signal and on a result of a logical operation with the second signal and the synchronization enabling signal.

A sixteenth aspect of the present disclosure is the clock synchronization method of the fifteenth aspect, wherein the first signal and the second signal are output aligned in phase in a case in which the synchronization enabling signal is active, and the first signal and the second signal are output unchanged in phase in a case in which the synchronization enabling signal is inactive.

A seventeenth aspect of the present disclosure is a clock synchronization method that includes generating a first signal and a second signal by receiving a signal output under a first clock with two logic circuits that respectively operate under a second clock that is different from the first clock, receiving the first signal, the second signal, and a first synchronization enabling signal for adjusting phases of the first signal and the second signal, controlling the phases of the first signal and the second signal using a first output result from a logical operation performed on the second signal and on a result of a logical operation with the first signal and the first synchronization enabling signal, and using a second output result from a logical operation performed on the first signal and on a result of a logical operation with the second signal and the first synchronization enabling signal, receiving the first signal, the second signal, and a second synchronization enabling signal for adjusting phases of the first signal and the second signal, and controlling the phases of the first signal and the second signal using a third output result from a logical operation performed on the second signal and on a result of a logical operation with the first signal and the second synchronization enabling signal, and using a fourth output result from a logical operation performed on the first signal and on a result of a logical operation with the second signal and the second synchronization enabling signal.

An eighteenth aspect of the present disclosure is the clock synchronization method of the seventeenth aspect, wherein the first signal and the second signal are output aligned in phase in a case in which the first synchronization enabling signal is active, and the first signal and the second signal are output unchanged in phase in a case in which the first synchronization enabling signal is inactive; and the first signal and the second signal are output aligned in phase in a case in which the second synchronization enabling signal is active, and the first signal and the second signal are output unchanged in phase in a case in which the second synchronization enabling signal is inactive.

The present disclosure enables the provision of a clock synchronization circuit, semiconductor device, and clock synchronization method to convert circuit outputs having an asynchronous relationship to outputs having a synchronous relationship in cases in which there is a desire to synchronously control circuits having an asynchronous relationship by performing logical operations with a synchronization enabling signal.

What is claimed is:

1. A clock synchronization circuit comprising:
a signal generation circuit configured to generate a first signal and a second signal by receiving a signal output under a first clock with two logic circuits that respectively operate under a second clock that is different from the first clock; and
a synchronization circuit configured to:
receive the first signal, the second signal, and a synchronization enabling signal for adjusting phases of the first signal and the second signal, and
control the phases of the first signal and the second signal using a first output result from a logical operation performed on the second signal and on a result of a logical operation with the first signal and the synchronization enabling signal, and using a second output result from a logical operation performed on the first signal and on a result of a logical operation with the second signal and the synchronization enabling signal.

2. The clock synchronization circuit of claim 1, wherein the synchronization circuit comprises:
a first AND circuit taking a logical product of the first signal and the synchronization enabling signal;
a second AND circuit taking a logical product of the second signal and the synchronization enabling signal;
a first OR circuit taking a logical sum of the first signal and an output of the second AND circuit; and
a second OR circuit taking a logical sum of the second signal and an output of the first AND circuit.

3. The clock synchronization circuit of claim 1, wherein the synchronization circuit comprises:
a first AND circuit taking a logical product of the first signal and the synchronization enabling signal;
a second AND circuit taking a logical product of the second signal and the synchronization enabling signal;
a third AND circuit taking a logical product of the first signal and an output of the second AND circuit; and
a fourth AND circuit taking a logical product of the second signal and an output of the first AND circuit.

4. The clock synchronization circuit of claim 1, wherein the synchronization circuit outputs the first signal and the second signal aligned in phase in a case in which the synchronization enabling signal is active, and outputs the first signal and the second signal unchanged in phase in a case in which the synchronization enabling signal is inactive.

5. The clock synchronization circuit of claim 4, wherein the synchronization enabling signal is a signal of a first voltage in a case in which the synchronization enabling signal is active, and the synchronization enabling signal is a signal of a second voltage different from the first voltage in a case in which the synchronization enabling signal is inactive.

6. The clock synchronization circuit of claim 1, wherein the signal generation circuit comprises:
a first logic circuit configured to operate under the first clock;
a second logic circuit configured to receive a signal output from the first logic circuit and to operate under the second clock;
a third logic circuit in parallel to the second logic circuit and configured to receive the signal output from the first logic circuit and to operate under the second clock;
a fourth logic circuit configured to receive a signal output from the second logic circuit, to operate under the second clock, and to generate the first signal; and
a fifth logic circuit configured to receive a signal output from the third logic circuit, to operate under the second clock, and to generate the second signal.

7. A clock synchronization circuit comprising:
a signal generation circuit configured to receive a signal output under a first clock with two logic circuits respectively operating under a second clock that is different from the first clock, and to generate a first signal and a second signal;
a first synchronization circuit configured to:
receive the first signal, the second signal, and a first synchronization enabling signal for adjusting phases of the first signal and the second signal, and
control the phases of the first signal and the second signal using a first output result from a logical operation performed on the second signal and on a result of a logical operation with the first signal and the first synchronization enabling signal, and using a second output result from a logical operation performed on the first signal and on a result of a logical operation with the second signal and the first synchronization enabling signal; and
a second synchronization circuit configured to:
receive the first signal, the second signal, and a second synchronization enabling signal for adjusting phases of the first signal and the second signal, and
control the phases of the first signal and the second signal using a third output result from a logical operation performed on the second signal and on a result of a logical operation with the first signal and the second synchronization enabling signal, and using a fourth output result from a logical operation performed on the first signal and on a result of a logical operation with the second signal and the second synchronization enabling signal.

8. The clock synchronization circuit of claim 7, wherein:
the first synchronization circuit comprises:
a first AND circuit taking a logical product of the first signal and the first synchronization enabling signal,
a second AND circuit taking a logical product of the second signal and the first synchronization enabling signal,
a third AND circuit taking a logical product of the first signal and an output of the second AND circuit, and
a fourth AND circuit taking a logical product of the second signal and an output of the first AND circuit; and
the second synchronization circuit comprises:
a fifth AND circuit taking a logical product of the first signal and the second synchronization enabling signal,
a sixth AND circuit taking a logical product of the second signal and the second synchronization enabling signal,
a first OR circuit taking a logical sum of the first signal and an output of the sixth AND circuit, and
a second OR circuit taking a logical sum of the second signal and an output of the fifth AND circuit.

9. The clock synchronization circuit of claim 7, wherein:
the first synchronization circuit outputs the first signal and the second signal aligned in phase in a case in which the first synchronization enabling signal is active, and outputs the first signal and the second signal unchanged in phase in a case in which the first synchronization enabling signal is inactive; and the second synchronization circuit outputs the first signal and the second signal aligned in phase in a case in which the second synchronization enabling signal is active, and outputs the first signal and the second signal unchanged in phase in a case in which the second synchronization enabling signal is inactive.

10. The clock synchronization circuit of claim 9, wherein:
the first synchronization enabling signal is a signal of a first voltage in a case in which the first synchronization enabling signal is active, and the first synchronization enabling signal is a signal of a second voltage different from the first voltage in a case in which the first synchronization enabling signal is inactive; and
the second synchronization enabling signal is a signal of the first voltage in a case in which the second synchronization enabling signal is active, and the second synchronization enabling signal is a signal of the second voltage in a case in which the second synchronization enabling signal is inactive.

11. The clock synchronization circuit of claim 7, wherein the signal generation circuit comprises:
a first logic circuit configured to operate under the first clock;
a second logic circuit configured to receive a signal output from the first logic circuit and to operate under the second clock;
a third logic circuit in parallel to the second logic circuit and configured to receive the signal output from the first logic circuit and to operate under the second clock;
a fourth logic circuit configured to receive a signal output from the second logic circuit, to operate under the second clock, and to generate the first signal; and
a fifth logic circuit configured to receive a signal output from the third logic circuit, to operate under the second clock, and to generate the second signal.

12. The clock synchronization circuit of claim 11, wherein the first logic circuit, the second logic circuit, the third logic circuit, the fourth logic circuit, and the fifth logic circuit are flip-flops.

13. A semiconductor device comprising:
a signal output circuit configured to output a signal;
the clock synchronization circuit of claim 1 configured to generate at least two signals based on the signal output by the signal output circuit; and
a control circuit configured to operate based on the signals generated by the clock synchronization circuit.

14. A semiconductor device comprising:
a signal output circuit configured to output a signal;
the clock synchronization circuit of claim 7 configured to generate at least two signals based on the signal output by the signal output circuit; and
a control circuit configured to operate based on the signals generated by the clock synchronization circuit.

15. A clock synchronization method comprising:
generating a first signal and a second signal by receiving a signal output under a first clock with two logic circuits that respectively operate under a second clock that is different from the first clock;
receiving the first signal, the second signal, and a synchronization enabling signal for adjusting phases of the first signal and the second signal; and
controlling the phases of the first signal and the second signal using a first output result from a logical operation performed on the second signal and on a result of a logical operation with the first signal and the synchronization enabling signal, and using a second output result from a logical operation performed on the first signal and on a result of a logical operation with the second signal and the synchronization enabling signal.

16. The clock synchronization method of claim 15, wherein:
the first signal and the second signal are output aligned in phase in a case in which the synchronization enabling signal is active, and the first signal and the second signal are output unchanged in phase in a case in which the synchronization enabling signal is inactive.

17. A clock synchronization method comprising:
generating a first signal and a second signal by receiving a signal output under a first clock with two logic circuits that respectively operate under a second clock that is different from the first clock;
receiving the first signal, the second signal, and a first synchronization enabling signal for adjusting phases of the first signal and the second signal;
controlling the phases of the first signal and the second signal using a first output result from a logical operation performed on the second signal and on a result of a logical operation with the first signal and the first synchronization enabling signal, and using a second output result from a logical operation performed on the first signal and on a result of a logical operation with the second signal and the first synchronization enabling signal;
receiving the first signal, the second signal, and a second synchronization enabling signal for adjusting phases of the first signal and the second signal; and
controlling the phases of the first signal and the second signal using a third output result from a logical operation performed on the second signal and on a result of a logical operation with the first signal and the second synchronization enabling signal, and using a fourth output result from a logical operation performed on the first signal and on a result of a logical operation with the second signal and the second synchronization enabling signal.

18. The clock synchronization method of claim 17, wherein:
the first signal and the second signal are output aligned in phase in a case in which the first synchronization enabling signal is active, and the first signal and the second signal are output unchanged in phase in a case in which the first synchronization enabling signal is inactive; and
the first signal and the second signal are output aligned in phase in a case in which the second synchronization enabling signal is active, and the first signal and the second signal are output unchanged in phase in a case in which the second synchronization enabling signal is inactive.

* * * * *